United States Patent

Hansen et al.

[11] Patent Number: 5,844,413
[45] Date of Patent: Dec. 1, 1998

[54] METHOD AND APPARATUS FOR GENERATING AND RECEIVING ELECTROMAGNETIC WAVES FOR TESTING PURPOSES

[75] Inventors: Diethard Hansen, Berikon, Switzerland; Detlef Ristau, Berlin, Germany; Thomas Schreiber, Berlin, Germany; Eva Roth, Berlin, Germany

[73] Assignee: Euro EMC Service Dr. Hansen GmbH, Germany

[21] Appl. No.: 769,994

[22] Filed: Dec. 19, 1996

[30] Foreign Application Priority Data

Dec. 21, 1995 [DE] Germany .................. 195 94 246.3

[51] Int. Cl.[6] .................................................. G01R 31/00
[52] U.S. Cl. .................... 324/627; 324/628; 324/632; 343/703
[58] Field of Search .............................. 343/703; 324/628, 324/627, 632

[56] References Cited

U.S. PATENT DOCUMENTS

| | | | |
|---|---|---|---|
| 5,066,921 | 11/1991 | Rope | 343/703 |
| 5,237,283 | 8/1993 | Carbonini | 324/628 |
| 5,432,523 | 7/1995 | Simmers | 343/703 |
| 5,440,316 | 8/1995 | Podgorski | 343/703 |
| 5,565,822 | 10/1996 | Gassmann | 343/703 |

FOREIGN PATENT DOCUMENTS 2014624 6/1994 Russian Federation ............... 343/703

OTHER PUBLICATIONS

Gonschorek, Karl Heinz; *Elektromagnetische Verträglichkeit*, B.G. Teubner, Stuttgart 1992, p. 414.

*Primary Examiner*—Ernest F. Karlsen
*Assistant Examiner*—Jose M. Solis
*Attorney, Agent, or Firm*—Londa and Traub LLP

[57] ABSTRACT

The invention describes a method and an apparatus for generating and receiving electromagnetic waves for test purposes and is applicable particularly for measurements, investigations and tests of electromagnetic compatibility. For testing the immunity, the test piece is acted upon with defined field parameters and, during the emission measurement, the electromagnetic radiation emitted by the test piece is measured. It is an important distinguishing feature of the invention that a cell, constructed as a TEM waveguide, is rotated about the test piece. The apparatus is characterized in that the lid and bottom of the pyramidal cell are constructed so as to be electrically conducting and in that two-dimensional septa, which consist of individual wires of equal length, are disposed in each case symmetrically at a small distance from the lid and the bottom.

14 Claims, 3 Drawing Sheets

METHOD AND APPARATUS FOR GENERATING AND RECEIVING ELECTROMAGNETIC WAVES FOR TESTING PURPOSES

BACKGROUND OF THE INVENTION

The invention relates to a method and an apparatus for generating and receiving electromagnetic waves for testing purposes and is applicable particularly for measurements, investigations and testing of electromagnetic compatibility. Various apparatuses for testing so-called EMI (Electromagnetic Interference) are known, which are based on pyramidally expanding TEM (transverse electromagnetic) waveguides.

For example, the EP 0 246 544 describes an apparatus for the EMI testing of electronic equipment with pyramidally expanding metal walls for generating TEM waves, the TEM waveguide being closed off by a wall of high-frequency peak absorbers and having an asymmetrically disposed, plate-shaped inner conductor, which is passed through the absorber wall to a number of terminal resistances. It is a disadvantage of this solution that unwanted, local and frequency-dependent inhomogeneities of the wave field arise and that the test space is limited by the arrangement of the plate-shaped inner conductor.

The EP 0 517 992 discloses an apparatus for EMI measurement, which has a septum, consisting of fifteen wires, which initially are disposed on an arc and then change over into a parallel arrangement. The septum is disposed asymmetrically in the cell and the field is a plane, vertically polarized wave. The termination is accomplished with parallel resistances behind the absorbers. The test piece is rotated about the y axis. It is a disadvantage of this solution that the test space also is limited by the absorber and by the large distance of the septum from the outer wall. Because of the large dimensions and the weight, special rooms are required for setting up this apparatus.

SUMMARY OF THE INVENTION

It is therefore an object of the invention to provide a method and an apparatus, with which reliable and reproducible, homogeneous electromagnetic fields can be generated or received by simple means and with which the cell is minimized with respect to its dimensions and its weight and the test space of which can be maximized.

Pursuant to the invention, this objective is accomplished by the distinguishing features in the characterizing part of claims 1 and 8 in conjunction with the distinguishing features in the respective introductory portions of the claims. Appropriate developments of the invention are contained in the dependent claims.

A particular advantage of the invention consists therein that, due to the rotational movement of the cell about the test piece, it is very easy to generate and receive polarized electromagnetic waves, which penetrate and leave the test piece two-dimensionally horizontally and vertically as well as in all other positions of the xy plane. The rotational movement of the cell can take place about the x axis as well as about the y axis. In conjunction with the 360° rotation of the turntable about the y or the x axis, the third space coordinate in the z direction is acquired. With that, every narrow beam lobe of the test piece can be detected by the interfering emission investigation. The measurement can be automated, thus saving much time.

Owing to the fact that the lid and the bottom of the cell are constructed to be electrically conductive and, at a small distance from the lid and bottom, in each case a two-dimensional septum, which consists of individual wires of the same length, is disposed symmetrically, great field homogeneity is attained.

A further advantage of the invention results from the fact that, because the capacity of the wires is less than that of a solid plate, the distance of the septa from the conducting walls is significantly less. This, in conjunction with lining the walls with flat ferrite absorbers permits the external dimensions and the weight to be decreased in comparison to the known state of the art, while the test volume remains the same size.

The lining of the side walls with ferrite absorbers dampens the multiple reflections at the side walls, as a result of which distortions of the field in the test volume are prevented. It is a further advantage of the wire arrangement that there are no cross currents, which result in the case of a fixed plate and occur as a source of an interfering electromagnetic field.

Due to the vertical arrangement of the terminal resistances and the slight distance of the septum from the conducting wall, an optimally short termination of the wire with its characteristic impedance is attained. The occurrence of parasitic inductivities is thus avoided and freedom from reflections up to high frequencies is attained. Due to the arrangement of wires, which end in an arc, the electrical paths and running times of the waves on the inner conductor are the same.

BRIEF DESCRIPTION OF THE DRAWINGS

The invention will be described in greater detail by means of examples, which are partly shown in the Figures, in which.

DETAILED DESCRIPTION OF THE INVENTION

Figure 1:
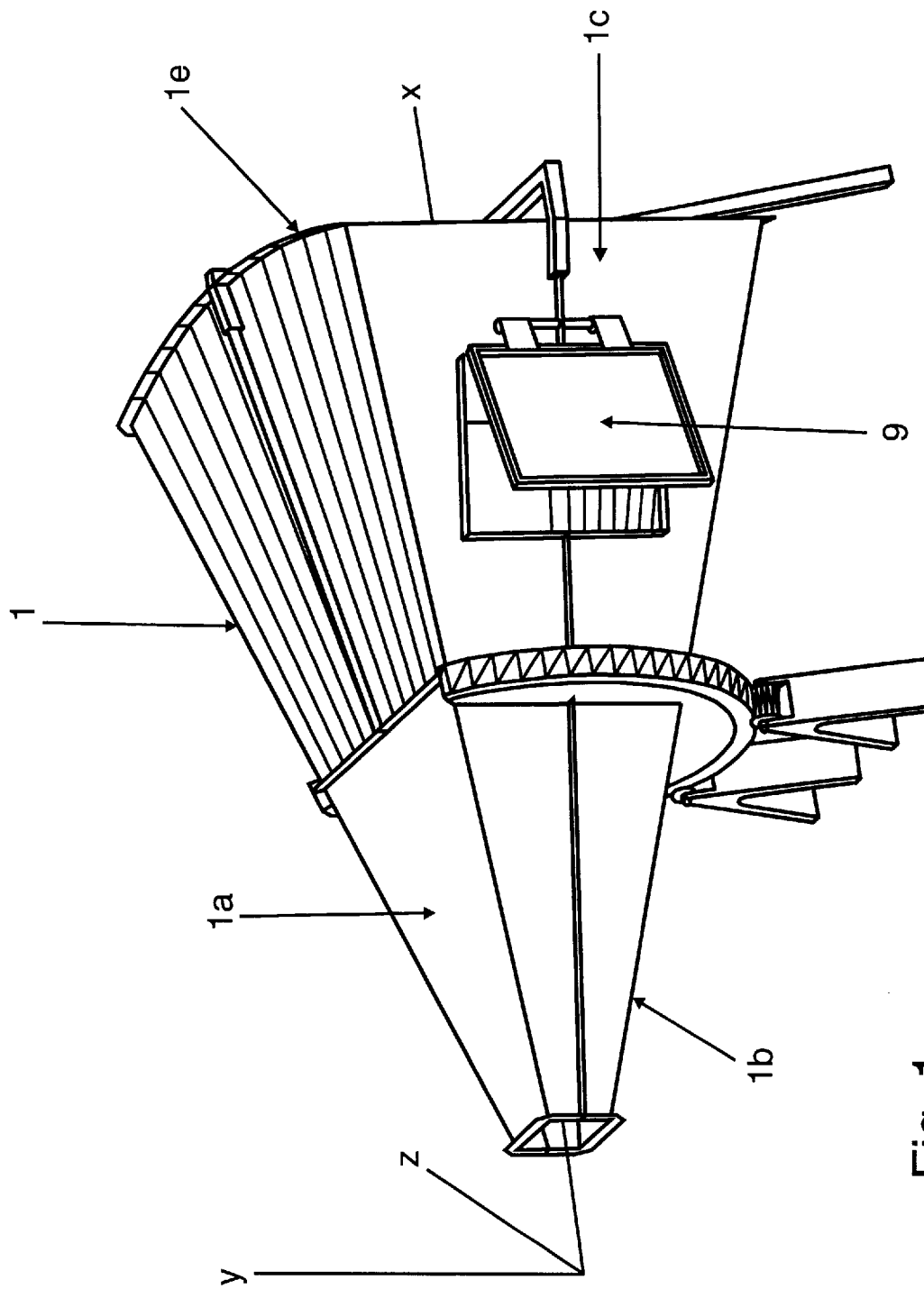
FIG. 1 shows a rotatably mounted cell for the rotation about the test piece about the x axis and FIG. 2 shows a view into the interior of the cell.
Figure 2:
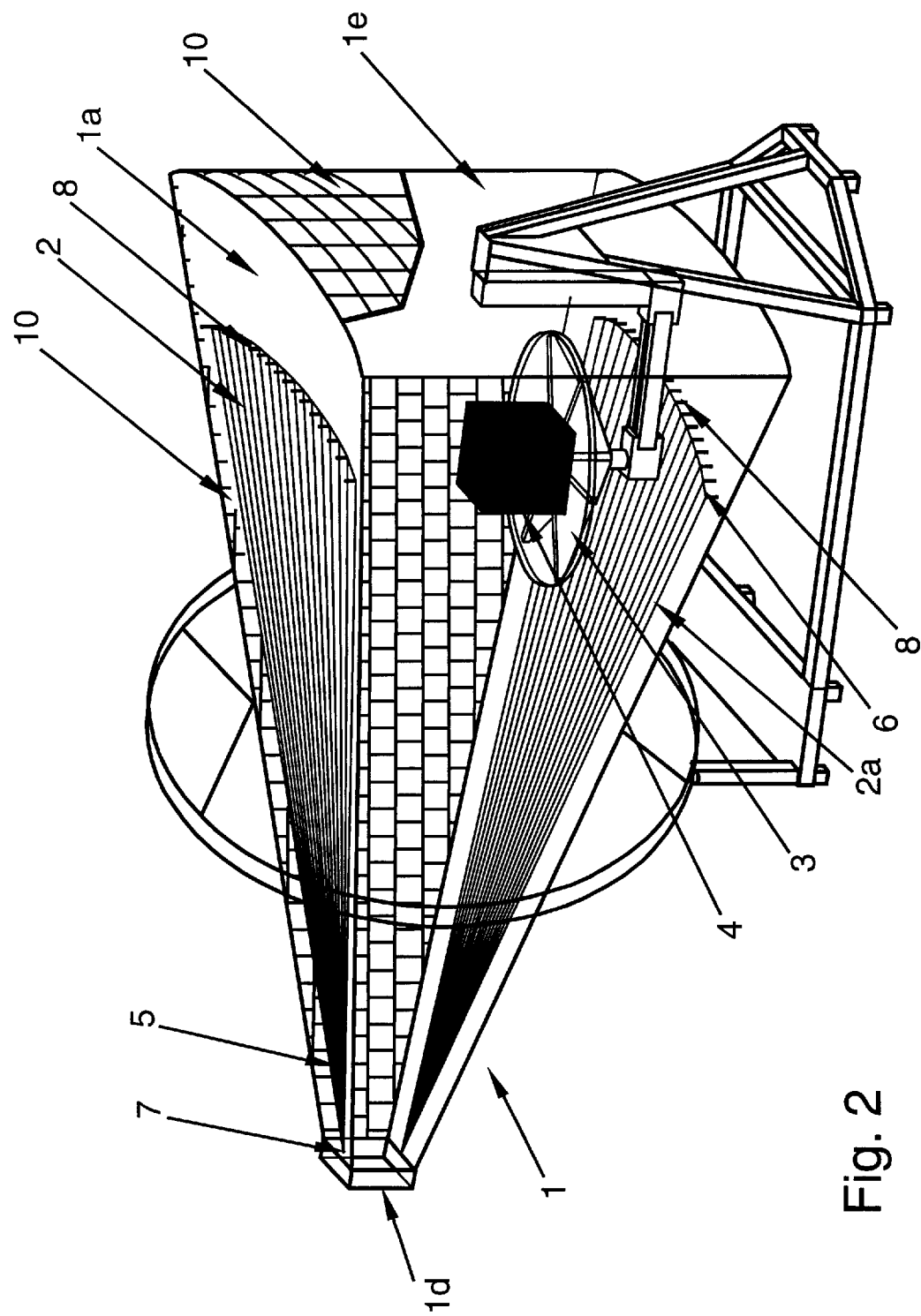
Figure 3:
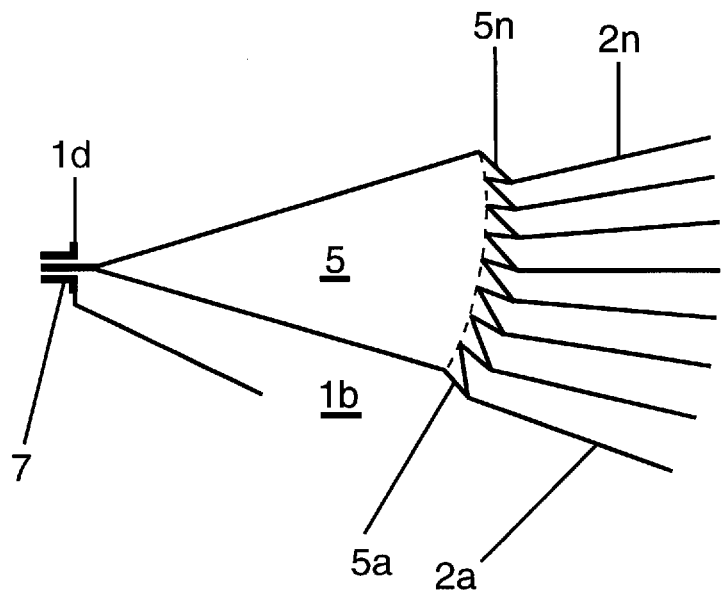
FIG. 3 shows a close-up of the apex region of FIG. 2, as a schematic representation.
Figure 4:
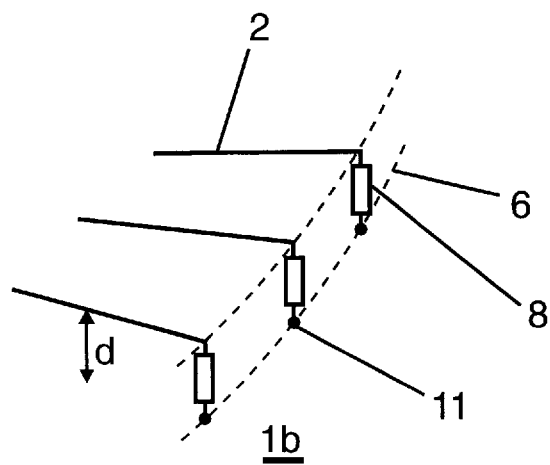
FIG. 4 shows a close-up of the base region of FIG. 2, as a schematic representation.

As can be inferred from FIGS. 1 and 2, cell 1 is a metallic pyramid with symmetrical sides, which is formed from a lid 1a, bottom 1b, side walls 1c and apex 1d and closed off with a rear wall 1e in the form of a cylindrical segment. The rear wall 1e and the two smaller side walls 1c are lined with ferrite absorbers 10. The ferrite absorbers 10 in the present example are constructed as flat tiles. The lid 1a and the bottom 1b of the pyramidal cell 1 are electrically conducting. Parallel to and at a small distance 'd' from (2.5 cm in the present example) the conducting walls 1a and bottom 1b, two septa 2 are mounted, which in each case consist of eighteen wires $2a \ldots 2_{18}$. The wires $2a \ldots 2_{18}$ spread out radially from the peak 1d of the cell 1 almost up to the rear wall 1e. As seen in FIGS. 2 and 4, the wire ends form an arc 6, as a result of which the length of the wires $2a \ldots 2_{18}$ and, with that, the running time of the wave on all wires $2a \ldots 2_{18}$ is the same. The wires $2a \ldots 2_{18}$ are terminated with low induction resistances $8a \ldots 8_{18}$, which are disposed vertically on the wires $2a \ldots 2_{18}$ and connect 11 the septa 2 with the lid 1a or with the bottom 1b of the cell 1. In the present example, the individual resistances $8a, \ldots 8_{18}$ have the value 450 Ω, the resistance in a parallel circuit thus amounting to 25 Ω for each septum 2. At the other side of the cell 1, the wires $2a \ldots 2_{18}$ are each connected to a short metal sheet 5 with prongs $5a \ldots 5_{18}$, which is connected to SMB connectors 7 (FIG. 3).

At the input, the electromagnetic energy from one of the CW generators, which is not shown in the Figures, is supplied over a balun to the septa 2. Instead of supplying energy in this manner, it is equally possible to connect to high speed, high voltage pulse generators in such a manner, that the voltage is doubled between the two septa 2. By these means, the frequency-limiting property of the balun is circumvented and optionally expanded up to the frequency of 0 Hz (cycle per second). At least one of the side walls 1c, there is an HF-tight door 9, through which a test piece 4 can be placed on a turntable 3, which can be rotated in this example through 360° about the y axis.

According to this example, cell 1 is mounted on two undercarriages at a height of approximately 1.4 m, so that rotation of cell 1 in the xy plane through 360° is possible. The rotational movement of the cell 1 is brought about by an electric motor. Advisably, the cell 1 can be positioned in steps of 1°. The turntable 3 does not rotate along with the cell 1, but is driven, independently of the motion of the cell 1, externally over a separate motor. All motors are disposed outside of the cell 1.

The mode of functioning of the cell 1 will be described in the following for the immunity measurement as well as for the emission measurement on a test piece 4, which is in the interior of the cell 1.

The measurement range of the cell 1 extends from more than 100 kHz up into the region in excess of 10 GHz. The CW generator has a typical output of 100 W. The test piece 4 is positioned on a turntable 3 centrally between the two septa 2 and rotated with a resolution of 1° about the y axis. For the immunity measurement, a signal of a CW generator is fed in at the apex 1d of the cell 1 over a balun. This signal spreads out as a TEM wave on the septa 2 and produces a vertical, electrical field between the septa 2. The TEM wave consequently has a vertical superimposed E and H field, which corresponds to the distant field conditions. The field, generated in cell 1, is polarized in one direction. In order to act on the test piece 4 from all sides with the field, the plane of polarization of the field must be changed. In the case of this example, this change is brought about by rotating cell 1 in the xy plane, that is, about the x axis about the test piece 4. The z component of the space coordinates is checked by rotating the test piece 4.

The test piece 4, acted upon with this test field, is observed for changes in its operating state. For measuring the emission, a receiver, which is also not shown in the Figures, is connected to the apex 1d of the cell 1. The septa 2 function as receiving arrangement and conduct the captured interfering radiation of the test piece 4 to the receiver. In order to explore all possible interference-emitting planes and also to receive narrow transmitting lobes, it is advisable to rotate the cell 1 and the turntable 3 with an accuracy of 1°. The rotations, the reception and the coupling-in of the waves is carried out fully automatically over the whole measurement range and the values, together with the associated limiting values, are recorded in the protocol. The limiting values are recorded in so-called free field measurement methods. The cell measurement values are converted correspondingly to these.

The invention is not limited to the examples described here. Rather, it is possible, by varying the means and distinguishing features, to realize further variations of the embodiment without departing from the scope of the invention.

LIST OF REFERENCE SYMBOLS 1 cell
1a lid
1b bottom
1c side walls
1d apex
1e rear wall
2 septum
2a to 2n wires
3 turntable
4 test piece
5 metal sheet
5a to 5n prongs
6 arc
7 SMB socket
8a to 8n resistances
9 HF-tight door
10 ferrite absorber

We claim:

1. A method for measuring the electromagnetic capability of a test object, comprising placing the test object on a rotatable turntable within a closed cell, rotating the cell about the x-axis, rotating the turntable about the y-axis, and taking measurements relative to determining the electromagnetic capability of the test object in the x, y and z directions.

2. An apparatus for measuring the electromagnetic capability of a test object, comprising a rotatable turntable for supporting the test object, the turntable being situated within a closed cell, the cell being rotatable about the x-axis, and the turntable being rotatable about the y-axis, independently from the rotation of the cell, and means for taking measurements relative to determining the electromagnetic capability of the test object in the x, y and z directions.

3. The apparatus of claim 2, wherein the closed cell comprises a transverse electromagnetic wave guide in the form of a pyramidal cell having four faces, an apex and a base, wherein the x-axis runs from the apex to the base of the pyramid, the cell having opposing upper and lower faces being electrically conducting, a first septum being situated at a small distance from and parallel to the upper face, a second septum being situated at a small distance from and parallel to the lower face, each of said first and second septums and comprising a plurality of wires of identical length arrayed symmetrically in a plane.

4. The apparatus of claim 3, wherein the base and the side walls are lined with ferrite absorbers.

5. The apparatus of claim 4, wherein the ferrite absorbers are constructed as flat tiles.

6. The method of claim 1, wherein the rotation of the turntable is effected for 360°, and the rotation of the cell is effected for at least 180°.

7. The method of claim 1, wherein the rotation one or both of the cell and the turntable takes place in 1° steps.

8. The apparatus of claim 3, wherein the cell is terminated at the apex either by an impedance-adapted balun or by two high-speed, impedance-adapted, high-voltage pulse generators.

9. The apparatus of claim 3, wherein the wires extend radially from the apex of the cell to the base.

10. The apparatus of claim 9, wherein the wires fan out radially from a metal sheet at prongs extending therefrom and end shortly before the rear wall in the form of an arc.

11. The apparatus of claim 10, wherein the metal sheet is connected to SMB sockets.

12. The apparatus of claim 3, wherein the wires are terminated with low-induction resistances.

13. The apparatus of claim 12, wherein the resistances are disposed vertically on the wires and connect the septa with the upper face or the bottom face.

14. The apparatus of claim 3, wherein an HF-tight door is disposed in at least one of the side walls.

\* \* \* \* \*